(12) United States Patent
Zocher et al.

(10) Patent No.: US 9,002,308 B1
(45) Date of Patent: Apr. 7, 2015

(54) RECEIVER AUTOMATIC GAIN CONTROL (AGC) AND SLICER

(75) Inventors: Andrew G. Zocher, Monticello, IL (US); Richard D. Davis, Champaign, IL (US); Theron L. Jones, White Heath, IL (US); Luiz A. Razera, Jr., Scotts Valley, CA (US); Robert R. Rotzoll, Cascase, CO (US)

(73) Assignee: Maxim Integrated Products, Inc., San Jose, CA (US)

( * ) Notice: Subject to any disclaimer, the term of this patent is extended or adjusted under 35 U.S.C. 154(b) by 318 days.

(21) Appl. No.: 13/488,267

(22) Filed: Jun. 4, 2012

(51) Int. Cl.
*H04B 1/06* (2006.01)
*H04B 7/00* (2006.01)
*H04B 10/60* (2013.01)
*H04B 1/62* (2006.01)

(52) U.S. Cl.
CPC .......................................... *H04B 1/62* (2013.01)

(58) Field of Classification Search
CPC ............... G02B 27/2264; G02B 27/22; H04N 13/0497; H04N 13/0438; H04N 2213/008; G06E 1/02; H04B 10/60; H04B 10/06; G02F 1/1335
USPC .......... 455/234.1, 240.1, 245.1, 245.2, 246.1, 455/232.1, 234.2, 41.1, 41.2, 41.3; 398/202–204, 207–208, 212; 359/107, 359/464
See application file for complete search history.

(56) References Cited

U.S. PATENT DOCUMENTS

| | | | |
|---|---|---|---|
| 2010/0309535 A1 | 12/2010 | Landowski et al. | |
| 2012/0113335 A1* | 5/2012 | Rotzoll et al. | 349/13 |
| 2013/0002654 A1* | 1/2013 | Yeh et al. | 345/419 |
| 2013/0169697 A1* | 7/2013 | Park et al. | 345/690 |
| 2014/0210873 A1* | 7/2014 | Kim | 345/690 |

OTHER PUBLICATIONS

Rick Heineman; RealD Introduces Universal Active 3D Eyewear Technology; Jan. 6, 2011; pp. 1-3.

* cited by examiner

*Primary Examiner* — Pablo Tran
(74) *Attorney, Agent, or Firm* — Advent, LLP

(57) ABSTRACT

A system is disclosed that may include an Automatic Gain Control (AGC) module configured to automatically adjust the gain of a receiver, which is configured to receive a signal. The signal includes a number of commands, which have a characteristic command length and a characteristic command interval. The command length may have a substantially shorter duration than the command interval. The system may also include a slicer configured to interface to a command processor. The system includes a command processor communicatively coupled with the AGC module and/or the slicer for providing a notification to the AGC module and/or the slicer associated with the ends of the commands. The AGC module is configured to adjust the gain of the receiver and the slicer threshold voltage is updated when the notification is received from the command processor.

16 Claims, 7 Drawing Sheets

RECEIVER AUTOMATIC GAIN CONTROL (AGC) AND SLICER

BACKGROUND

Three-dimensional (3-D) displays are designed to project visual information into a field and to provide a viewer with a stereoscopic perception of depth within that field. This technique can be used with, for example, a 3-D television (3-D TV) for home entertainment. Generally, 3-D displays furnish offset images that are filtered and provided separately to the left and right eyes of a viewer. In some instances, images are split by a light source and separately directed to each eye, while in other instances a viewer wears eyeglasses that filter separately offset images to each eye. Anaglyphic image techniques can be used to provide a stereoscopic 3-D effect when glasses with different lens colors (e.g., red and cyan) are used to view an image that contains two differently filtered colored images, one for each eye. Polarization can also be used to provide a stereoscopic 3-D effect by projecting offset images using differently polarized light. Glasses having differently polarized lenses for each eye are used to view the images.

Alternate-frame sequencing techniques can be used to generate two channels of offset images that are sequentially displayed (e.g., on a single display), while glasses having active shutter filters are used to filter the images from each channel separately to each eye. Active shutter glasses (active eyewear), such as Liquid Crystal Shutter (LCS) glasses, can be used with alternate-frame sequencing to provide a stereoscopic 3-D effect for a viewer. Active shutter glasses employ a lens for each eye that includes a liquid crystal layer that darkens (e.g., becomes opaque) when voltage is applied, but is otherwise substantially transparent. The glasses can be controlled via wireless communication (e.g., using Infrared (IR), Radio Frequency (RF), and so forth) from a transmitter that provides a timing signal. The timing signal instructs the glasses to alternately darken one lens and then the other in synchronization with the refresh rate of the display while the display alternates between images having different perspectives for each eye.

SUMMARY

Techniques are disclosed for automatically adjusting the gain of a receiver and/or for automatically adjusting the threshold of a slicer operating on the analog output of the receiver, where the receiver can be used to receive a signal that may have a low duty cycle, and may be implemented using a number of different command formats. In one or more implementations, the techniques may be implemented using a system that includes an AGC module configured to automatically adjust the gain of a receiver. The signal includes a number of commands, which have a characteristic command length and a characteristic command interval. The command length may have a substantially shorter duration than the command interval. The system may also include a slicer configured to generate a threshold based upon the analog output of the receiver. The system includes a command processor communicatively coupled with the AGC module and/or the slicer that is configured to provide a notification to the AGC module and/or the slicer associated with the ends of the commands. The AGC module is configured to adjust the gain of the receiver, while the slicer is configured to adjust a slicer threshold when the notification is received from the command processor.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

FIG. 1 is a block diagram illustrating a system for automatically adjusting the gain of a receiver using an AGC module and/or for automatically adjusting the threshold of a slicer operating on the output of the receiver, where the receiver can be used to receive a signal that may have a low duty cycle, and may be implemented using a number of different command formats in accordance with example implementations of the present disclosure.

FIG. 2 is a diagrammatic illustration of an example environment for employing the system illustrated in FIG. 1, where the system is employed with a pair of active shutter glasses for viewing a 3-D HDTV in accordance with example implementations of the present disclosure.

FIG. 3 is a block diagram illustrating components for automatically adjusting the gain of a receiver using an AGC module and/or for automatically adjusting the threshold of a slicer operating on the analog output of the receiver, where the receiver can be used to receive a signal that may have a low duty cycle, and may be implemented using a number of different command formats in accordance with example implementations of the present disclosure.

FIG. 4 is a timing diagram illustrating a sequence of actions for automatically adjusting the gain of a receiver using an AGC module and/or for automatically adjusting the threshold of a slicer operating on the output of the receiver in accordance with example implementations of the present disclosure.

FIG. 5 is a circuit diagram illustrating components for automatically adjusting the gain of a receiver using an AGC module and/or for automatically adjusting the threshold of a slicer operating on the analog output of the receiver, where the receiver can be used to receive a signal that may have a low duty cycle, and may be implemented using a number of different command formats in accordance with example implementations of the present disclosure.

DETAILED DESCRIPTION

Overview

Figure 1:
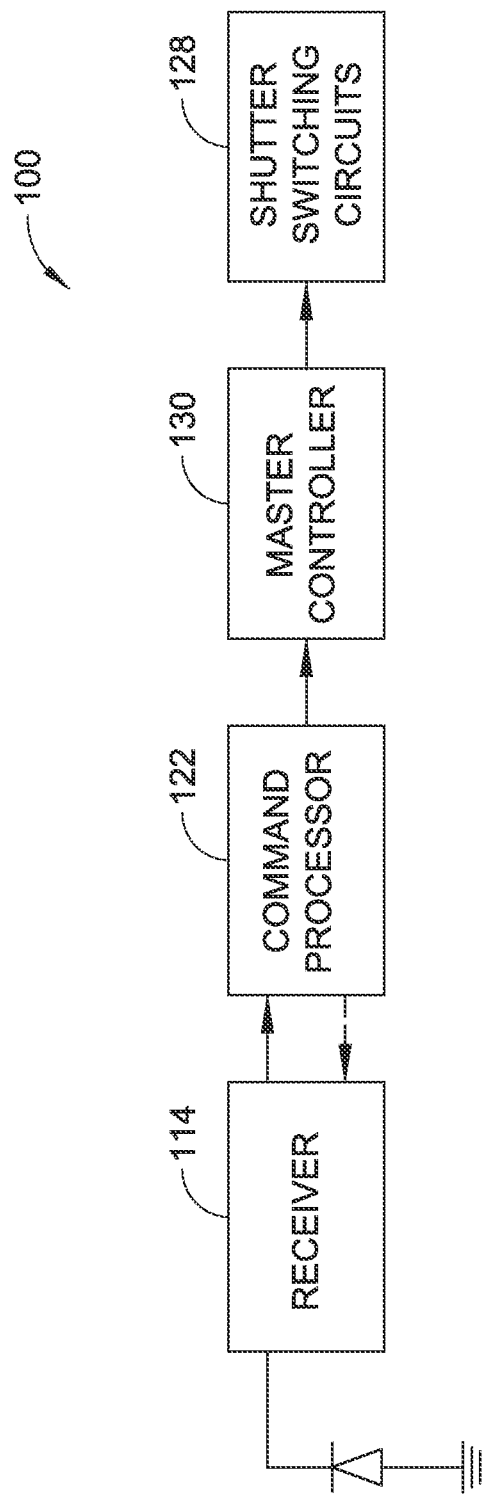

When a signal from an emitter of a 3-D display is transmitted to a receiver in a pair of active shutter glasses, the signal strength can vary greatly depending upon the distance of the viewer from the transmitter. This widely varying signal strength typically requires a large control range for signal reception equipment. For example, the control range of automatic gain control circuitry may vary as much as one hundred decibels (100 dB) with respect to near and far distances from a transmitter (e.g., across a viewing area such as a small room in a residence, a large theatre, and so forth). The response of automatic gain control equipment should also be relatively fast for interactive applications such as gaming applications and the like. For example, a transmitter may transmit short synchronization commands, e.g., commands having durations of about eighty microseconds (80 μs) to a receiver in a pair of active shutter glasses. The duty cycle of the synchronization commands may be relatively low, ranging from, for instance, about one percent to about ten percent (1%-10%). Further, the synchronization commands typically do not include an embedded preamble to help a receiver synchronize or "warm up." The synchronization commands may also comprise a multiplicity of command formats, carrier frequencies, and so forth, depending upon manufacturer, model of 3-D display, and the like.

In some instances, analog automatic gain control circuitry can be used with active shutter glasses to receive synchronization signals from an IR transmitter. However, when IR is used to transmit synchronization information, a number of sources of interference in the surrounding environment, such as sunlight, incandescent light bulbs, fluorescent lamps, and so forth may interfere with the transmission. Thus, such circuitry acts on the interference. Further, analog automatic gain control circuitry characteristics may not be adaptable, and may require different response timing (e.g., based upon different coding schemes, ambient noise conditions, and so forth). For example, analog AGC circuitry requires a long time constant to span the interval between one command and the next, which can lead to degraded attack and/or decay time of the AGC. This type of circuit may be expensive to implement in an Integrated Circuit (IC). Long time constants may also be required in the slicer with this type of implementation.

Additionally, active shutter glasses are generally configured to function with a single type of display, such as a 3-D High Definition Television (3-D HDTV) display from one particular manufacturer. For example, different manufacturers may use different synchronization information. Thus, a typical pair of active shutter glasses may work only with a specific display or with displays of a same or similar type or brand, creating additional cost and inconvenience for a viewer.

Accordingly, systems are described for automatically adjusting the gain of a receiver using an AGC module and/or for automatically adjusting the threshold of a slicer operating on the analog output of the receiver, where the receiver can be used to receive a signal that may have a low duty cycle, and may be implemented using a number of different command formats. The systems include an AGC module and a command processor. The AGC module is configured to automatically adjust the gain of a receiver, which is configured to receive a signal that comprises commands received from a transmitter, such as IR commands, RF commands, and so forth. The command processor is configured to notify the AGC module at the end of each command from the transmitter so that the AGC module can adjust the gain of the receiver after each command has ended (as opposed to continuously adjusting the gain). In implementations, a receiver, an AGC module, and a command processor may be furnished on a single Integrated Circuit (IC) chip, enabling a smaller and lighter form factor for active shutter glasses and other electronic equipment that use systems configured in accordance with the present disclosure.

In implementations, the AGC module operates on the peak of a signal (e.g., using a peak detector) rather than on the energy of a signal. Thus, these systems may be particularly well suited for short synchronization commands. Further, because the AGC is not continuous, voltage decrease ("droop") between commands can be eliminated for low duty cycle command implementations. Thus, example systems may eliminate the continuous-time AGC tradeoff between release time and voltage "droop." Due to the reaction time and agility of these configurations, the systems can be configured to operate with a number of different command formats without necessitating component changes.

Example Implementations

Figure 2:
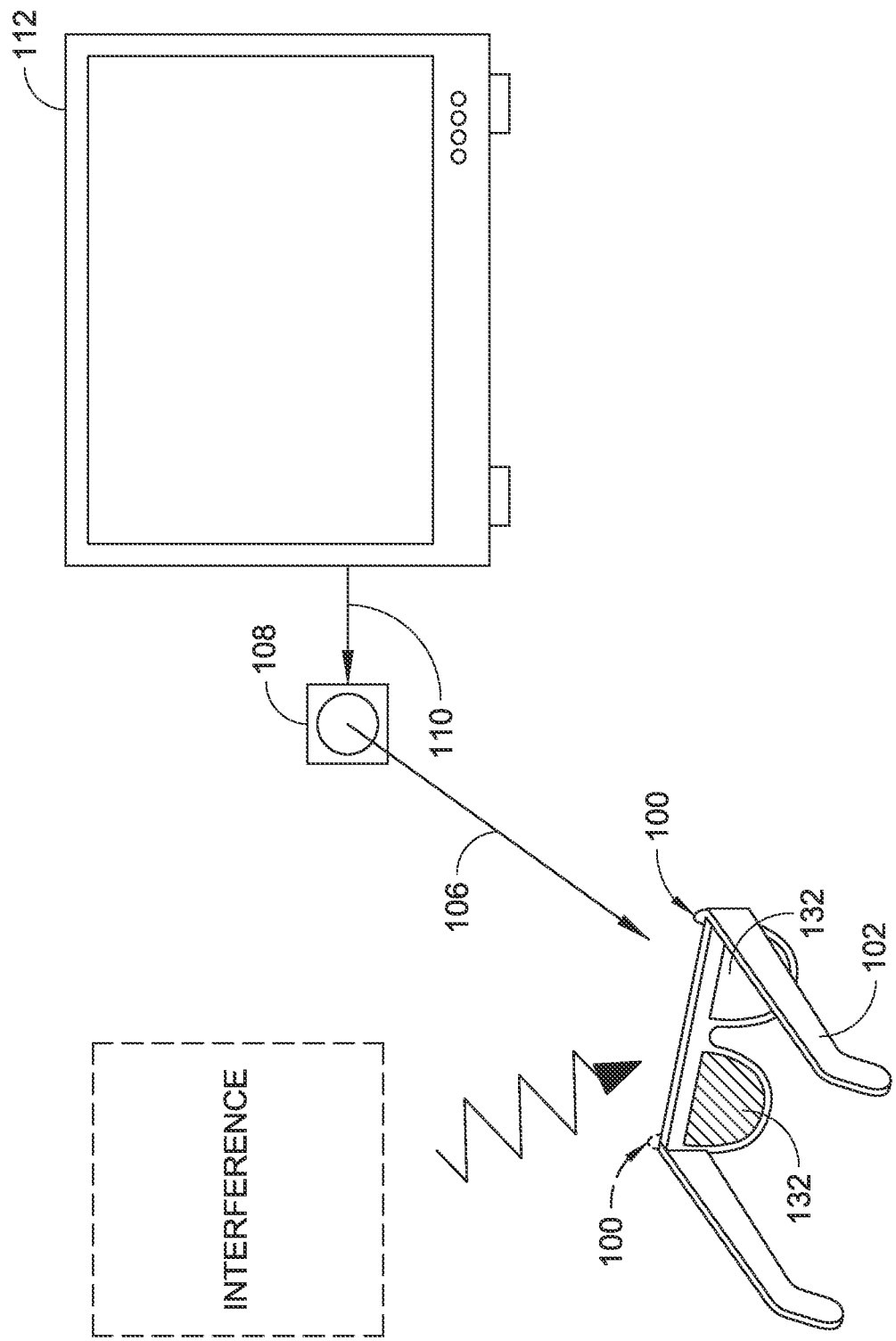

FIGS. 1 through 6 illustrate example systems 100 configured to automatically adjust the gain of a receiver, which is configured to receive a signal from a transmitter. In implementations, the signal comprises commands having a low duty cycle, and may comprise one of a number of different command formats. The systems 100 are configured to enhance the operational range of signal reception and improve interference rejection of signals. One or more systems 100 may be used with eyewear such as, but not necessarily limited to, goggles, glasses, active shutter glasses 102 (e.g., as illustrated in FIG. 2), and so forth. The systems 100 may also be used with other equipment configured to receive signals such as IR signals, RF signals, and so forth. System 100 includes a mixed-mode AGC module 104 (e.g., implemented using AGC circuitry) configured to automatically adjust the gain of a receiver 114, which is configured to receive a signal 106 from a transmitter 108, such as an amplitude-modulated IR carrier signal, an RF signal, and so forth. In implementations, the signal 106 may be a synchronization signal 110 transmitted from a 3-D HDTV 112.

The signal 106 may be received from the transmitter 108 and furnished to the AGC module 104 using, for example, a receiver 114. The receiver 114 may be an IR receiver, an RF receiver, and so forth. For example, an IR receiver 114 may be implemented along with a photodiode. The signal 106 comprises multiple commands 116 and has a characteristic command length 118 and a characteristic command interval 120, where the command length 118 has a substantially shorter duration than the command interval 120. For example, the signal 106 may comprise synchronization commands having a duty cycle ranging from at least approximately one percent to at least approximately ten percent (1%-10%). However, this range is provided by way of example only and is not meant to be restrictive of the present disclosure. Thus, systems 100 may be used with signals having other duty cycles, such as twenty percent (20%), thirty percent (30%), and so forth.

Figure 4:
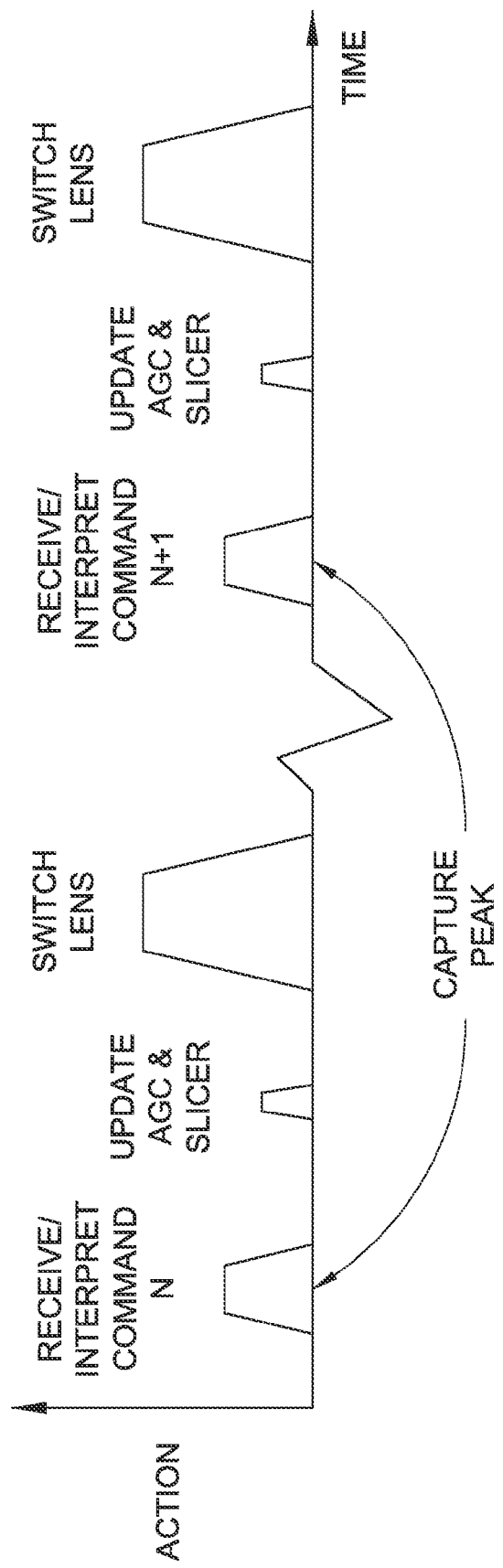

The AGC module 104 is communicatively coupled with a command processor 122, and the command processor 122 is configured to provide a notification (e.g., an update pulse/signal 124) to the AGC module 104 associated with the ends of the commands 116. The AGC module 104 is configured to adjust the gain of the receiver 114 only when the update signal 124 is received from the command processor 122. For example, the update signal 124 may trigger an AGC switched-capacitor integrator. Thus, the resulting gain of the receiver 114 is constant (or at least substantially constant) during a command 116 and changes only after the command 116 is finished. In example implementations, the amplitude of the signal at the output of the receiver 114 may be held constant by the AGC module 104, even as the amplitude of the signal 106 at the input of the receiver varies by more than one hundred decibels (100 dB). In this manner, the AGC is not continuous. In implementations, the AGC module 104 operates on the peak of the signal 106 (e.g., using a peak detector 126) rather than on the energy of a signal. For example, as illustrated in FIG. 4, the peak of the signal 106 may be captured during a command 116, while the command is received and interpreted by the command processor 122.

Further, the AGC module 104 may be updated during a quiet time (e.g., when other circuitry, such as lens switching circuitry and the like, is not active).

Figure 6:
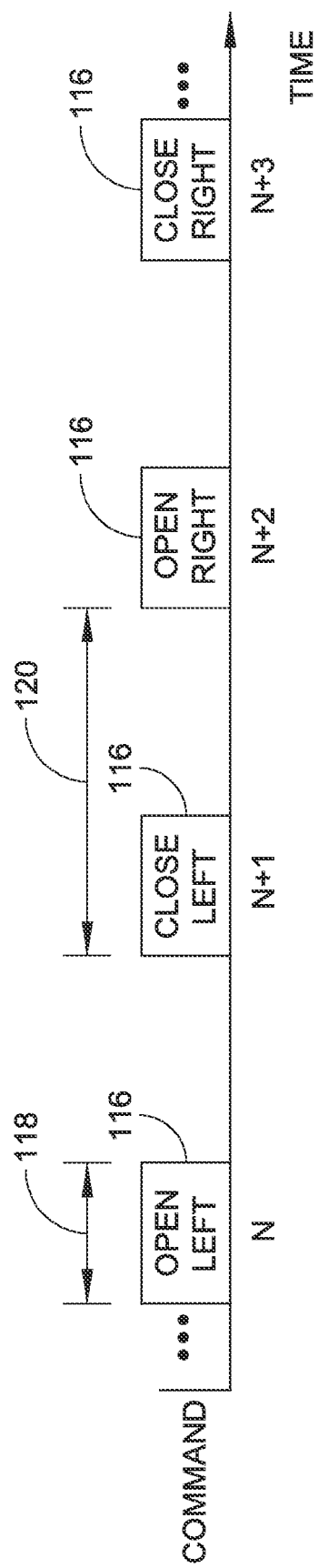
FIG. 6 is a timing diagram illustrating a sequence of synchronization commands furnished by a 3-D TV, such as the 3-D HDTV illustrated in FIG. 2.

In implementations, the command processor 122 may include a database, a table, and so forth, which may be stored in an electronic memory, and may include information associated with various command structures, such as command structures for 3-D TV's from different manufacturers. The command processor 122 can be configured to use one or more characteristics of the signal 106 to determine a data format and/or a type of display associated with the commands 116 included with the signal 106. For example, the command processor 122 may use command length 118 and/or command interval 120 (e.g., as illustrated in FIG. 6) and/or another characteristic of the signal 106 to determine a particular command structure associated with 3-D HDTV 112.

The command processor 122 may be used to synchronize active shutter glasses 102 with the 3-D HDTV 112. For example, the system 100 may also include switch circuitry, such as shutter switching circuitry 128 coupled with the command processor 122 via a master controller 130 and configured to alternately darken and lighten one or more lenses 132 in synchronization with 3-D HDTV 112. In implementations, the master controller 130 can also be configured to monitor a battery (e.g., determine battery state, battery charge, battery life, and so forth), determine whether the active shutter glasses 102 are on charging assembly, whether the active shutter glasses 102 are in use, and so forth.

Figure 5:
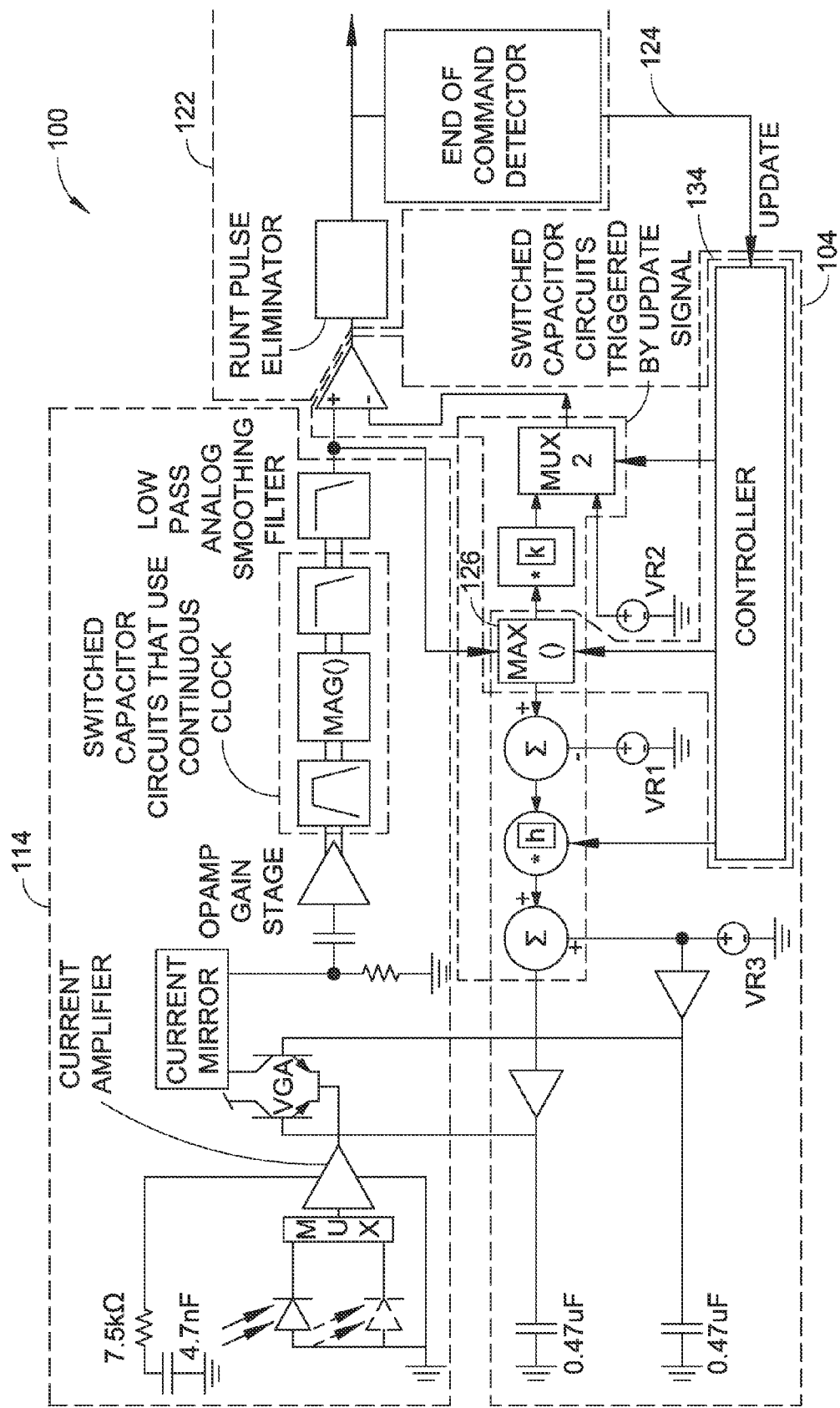

The system 100 may also include a slicer 134. The slicer 134 is operatively configured to translate analog information to digital information for the command processor 122. For example, as illustrated in FIG. 5, the slicer 134 may include circuitry configured to determine the threshold voltage of a comparator. The analog output of the receiver 114 may be applied to the positive (+) input of the comparator and a threshold voltage may be applied to the negative (−) input of the comparator. In implementations, the threshold voltage used for command N+1 is a scaled value of the peak signal amplitude at the analog output of the receiver during command N. The digital output of the slicer 134 then serves as the input to the command processor 122. The update signal 124 may also serve as a trigger for a switched-capacitor slicer threshold voltage generator. In this manner, the AGC module 104 and the slicer 134 circuits are "clocked" by the command processor 122. The slicer 134 can also be configured to operate on the peak of the signal 106 (e.g., using the peak detector 126) rather than on the energy of a signal.

Referring now to FIG. 5, decoding a command N+1 is described with reference to example implementations of system 100. An input signal may be received from one or more IR diodes and amplified, detected and filtered by receiver 114. The analog output of the receiver 114 may serve as the input to both mixed-mode AGC 104 and mixed-mode slicer 134. A peak detector 126 may be common to both the mixed-mode AGC 104 and the mixed-mode slicer 134. In one instance, for multiplexer MUX2, the threshold voltage for the slicer 134, which is applied to the negative (−) input of the comparator, is determined by a fraction of the peak voltage at the analog output of the receiver during command N. In another instance, for the multiplexer MUX2, the threshold voltage for the slicer 134, which is applied to the negative (−) input of the comparator, is voltage VR2. The voltage VR1 was subtracted from the peak voltage of the analog output of the receiver during command N. This difference was scaled and offset to set the gain of the receiver during command N+1. Similarly, the gain of the receiver during command N+2 is set by the scaled difference between the peak analog receiver output voltage during command N+1. Thus, at steady state, the peak voltage at the analog receiver output approaches VR1.

In implementations, the state of the AGC module 104 and/or the threshold of the slicer 134 are adjusted only on the rising edge of the update signal 124 from the command processor 122. Using this technique, long analog time constants are not required in the AGC module 104 or the slicer 134, and the command processor 122 has control over the update timing. The command processor 122 initiates an update immediately after determining the end of one command, N, so that the receiver 114 can adapt to be ready to receive the next command, N+1. This scheme can allow for extremely fast AGC acquisition, and the components used to implement the system may be well suited for integration. For example, the receiver 114, the AGC module 104, the slicer 134, and the command processor 122 (and possibly master controller 130 and/or shutter switching circuitry 128) can be formed on a single Integrated Circuit (IC) chip, a single Printed Circuit Board (PCB), and so forth. In some instances, the system 100 may be implemented using a System on a Chip (SoC) implementation.

Systems 100 employing mixed-mode techniques in accordance with the present disclosure can be used to build smaller and better-performing circuits (e.g., when compared to typical analog AGC implementations). Additionally, with the mixed-mode techniques described herein, the AGC module 104 and the slicer 134 need not be reconfigured for instrumentation that uses different command structures, such as 3-D TV's from different manufacturers, and so forth. For example, unlike time constants in an analog AGC and/or analog slicer threshold generation circuits, which must be reset for different command lengths 118 and command intervals 120, with the mixed-mode systems 100 described herein, the command processor 122 sends an update signal 124 to the receiver 114 at the end of command N so that the receiver 114 is ready for command N+1. Thus, the command length and command interval can vary without affecting the ability of the system 100 to receive commands having varying formats.

Between commands, the receiver 114 may be muted. For example, the receiver 114 can be set in a low sensitivity mode so that noisy events, such as shutter switching, can occur without disturbing the receiver operating point (e.g., as illustrated in FIG. 4). In this example implementation, all receiver circuits can remain enabled, and the peak detector 126 can remain reset in mute mode. In other implementations, the receiver 114 may be disabled between commands. Disabling the receiver 114 can be implemented as a mute function that furnishes current drain savings. In this configuration, the receiver 114 may then be enabled before the next command (e.g., command N+1). In further implementations, the receiver 114 may remain enabled and in a high-sensitivity mode, while the peak detector reset signal is held while the voltage at the analog output of the receiver settles, and the receiver 114 reaches a steady state after a gain change event. In this configuration, the peak detector reset time may be programmable.

Example Process

Figure 7:
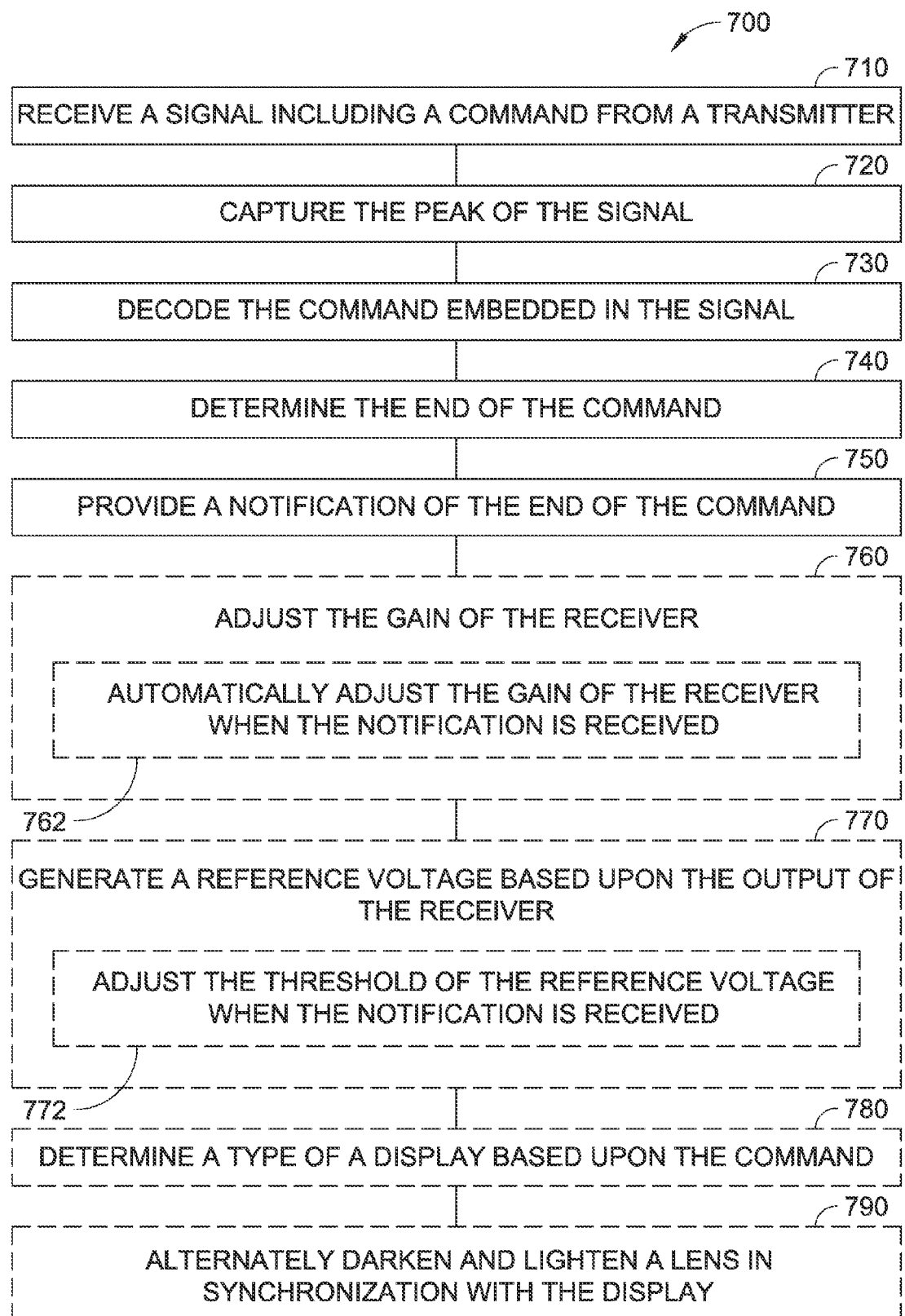
FIG. 7 is a flow diagram illustrating a method for automatically adjusting the gain of a receiver using an AGC module and/or for automatically adjusting the threshold of a slicer operating on the output of the receiver in accordance with example implementations of the present disclosure.

Referring now to FIG. 7, example techniques are described for automatically adjusting the gain of a receiver using an AGC module and/or for automatically adjusting the threshold of a slicer operating on the output of the receiver (e.g., where the slicer is operable to translate analog information to digital information). As previously discussed, the receiver can be used to receive a signal that may have a low duty cycle, and may be implemented using a number of different command formats.

Figure 3:
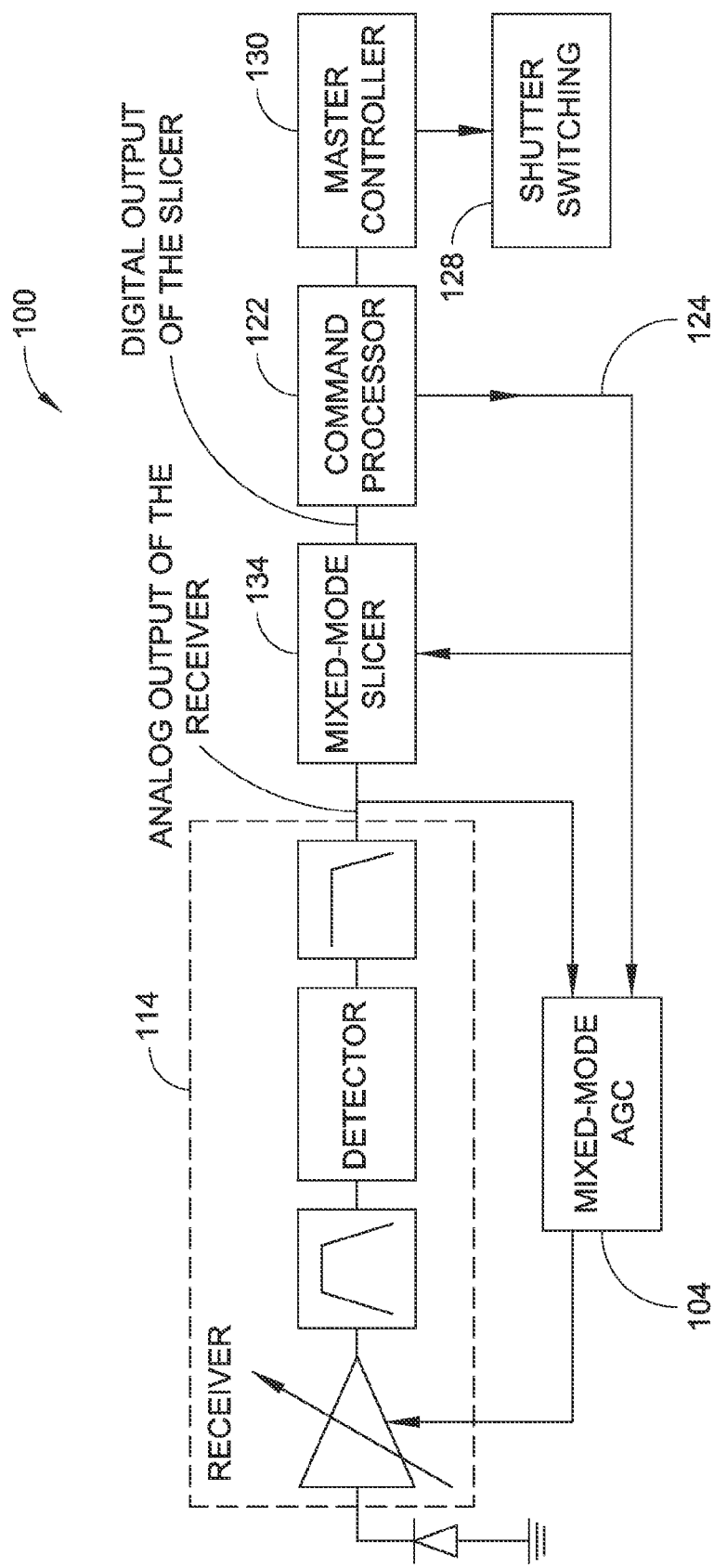

FIG. 7 depicts a process 700, in an example implementation, for automatically adjusting the gain of a receiver using an AGC module, such as the AGC module 104 illustrated in FIG. 3 and described above, and/or automatically adjusting the threshold of a slicer operating on the output of the receiver, such as the slicer 134 illustrated in FIG. 3 and described above. In the process 700 illustrated, a signal is received from a transmitter (Block 710). For example, with reference to FIGS. 1 through 6, signal 106 may be received from transmitter 108 using receiver 114. With reference to FIG. 3, receiver 114 may include a detector implemented using, for example, an AC-DC rectifier, one or more smoothing filters, including a low-pass analog smoothing filter, and so forth. The signal 106 includes multiple commands 116 and may have a low duty cycle (e.g., having a command length 118 of substantially shorter duration than a command interval 120). Then, a peak of the signal is captured (Block 720). Next, a command embedded within the signal is decoded (Block 730), and the end of the command is determined (Block 740). For instance, with continuing reference to FIGS. 1 through 6, command processor 122 may be used to decode command 116 embedded within signal 106 and determine the end of command 116.

Then, a notification of the end of the command is provided (Block 750). For example, with continuing reference to FIGS. 1 through 6, AGC module 104 is communicatively coupled with command processor 122, which is configured to provide update signal 124 to the AGC module 104 associated with the end of a command 116. In this manner, the gain of the receiver is adjusted (Block 760). In implementations, the gain of the receiver is adjusted only when the notification is received (Block 762). For instance, with continuing reference to FIGS. 1 through 6, AGC module 104 can be configured to adjust the gain of receiver 114 only when update signal 124 is received from command processor 122, e.g., using an AGC switched-capacitor integrator.

Further, with continuing reference to FIGS. 1 through 6, slicer 134 is communicatively coupled with command processor 122, which is configured to provide update signal 124 to the slicer 134 associated with the end of a command 116. In this manner, a slicer threshold voltage is generated based upon the output of the receiver (Block 770). In implementations, the threshold of the slicer is adjusted only when the notification is received (Block 772). For example, with continuing reference to FIGS. 1 through 6, slicer 134 can be configured to adjust the threshold for the slicer only when update signal 124 is received from command processor 122, e.g., using an AGC switched-capacitor slicer threshold voltage generator.

In implementations, a type of display can be determined based upon the command (Block 780). For instance, with continuing reference to FIGS. 1 through 6, command processor 122 can be configured to use one or more characteristics of signal 106 to determine a data format and/or a type of display associated with commands 116 included with signal 106. Further, a lens can be alternately darkened and lightened in synchronization with the display (Block 790). For example, with continuing reference to FIG. 1 through 6, command processor 122 may be used to synchronize active shutter glasses 102 with 3-D HDTV 112 using shutter switching circuitry 128 coupled with command processor 122 via master controller 130.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A system comprising:
an Automatic Gain Control (AGC) module configured to automatically adjust the gain of a receiver, the receiver configured to receive a signal from a transmitter, the signal comprising a plurality of commands having a characteristic command length and a characteristic command interval, the command length having a substantially shorter duration than the command interval;
a command processor communicatively coupled with the AGC module for providing a notification to the AGC module associated with the ends of the plurality of commands, the AGC module configured to adjust the gain of the receiver when the notification is received from the command processor; and
a slicer communicatively coupled with the command processor, wherein the command processor is configured to provide the notification associated with the ends of the plurality of commands to the slicer, and the slicer is configured to adjust a threshold when the notification is received from the command processor.

2. The system as recited in claim 1, further comprising a receiver coupled with the AGC module and configured to provide the signal to a mixed-mode slicer.

3. The system as recited in claim 2, wherein the receiver comprises at least one of an Infrared (IR) receiver or a Radio Frequency (RF) receiver.

4. The system as recited in claim 2, wherein the AGC module, the command processor, and the receiver comprise a System on a Chip (SoC).

5. The system as recited in claim 1, wherein the plurality of commands comprises synchronization commands from a transmitter associated with a display, and the command processor is configured to determine a type of the display based upon the characteristics of the plurality of commands.

6. The system as recited in claim 5, wherein the system is configured to control at least one lens of a pair of active shutter glasses and further comprises shutter switching circuitry configured to alternately darken and lighten the at least one lens in synchronization with the display.

7. A method comprising:
receiving a signal from a transmitter at a receiver, the signal comprising a plurality of commands having a characteristic command length and a characteristic command interval, the command length having a substantially shorter duration than the command interval;
determining the end of at least one of the plurality of commands;
providing a notification associated with the end of the at least one of the plurality of commands;
automatically adjusting the gain of the receiver only when the notification is received; and
generating a slicer threshold voltage, wherein a threshold for the slicer is adjusted only when the notification is received.

8. The method as recited in claim 7, wherein the signal comprises at least one of an Infrared (IR) signal or a Radio Frequency (RF) signal.

9. The method as recited in claim 7, the plurality of commands comprises synchronization commands from a transmitter associated with a display, and where the method further comprising determining a type of the display based upon the characteristics of the plurality of commands.

10. The method as recited in claim 9, further comprising alternately darkening and lightening at least one lens of a pair of active shutter glasses in synchronization with the display.

11. A system comprising:
an Automatic Gain Control (AGC) module configured to automatically adjust the gain of a receiver, the receiver configured to receive a signal from a transmitter, the signal comprising a plurality of commands having a characteristic command length and a characteristic command interval, the command length having a substantially shorter duration than the command interval;
a slicer configured to convert an analog output of the receiver to a digital output; and
a command processor communicatively coupled with the AGC module and the slicer for providing a notification associated with the ends of the plurality of commands, the AGC module configured to adjust the gain of the receiver and the slicer configured to adjust a threshold only when the notification is received from the command processor.

12. The system as recited in claim 11, further comprising a receiver coupled with the AGC module and the slicer and configured to provide the digital signal to the command processor.

13. The system as recited in claim 12, wherein the receiver comprises at least one of an Infrared (IR) receiver or a Radio Frequency (RF) receiver.

14. The system as recited in claim 12, wherein the AGC module, the slicer, the command processor, and the receiver comprise a System on a Chip (SoC).

15. The system as recited in claim 11, wherein the plurality of commands comprises synchronization commands from a transmitter associated with a display, and the command processor is configured to determine a type of the display based upon the characteristics of the plurality of commands.

16. The system as recited in claim 15, wherein the system is configured to control at least one lens of a pair of active shutter glasses and further comprises shutter switching circuitry configured to alternately darken and lighten the at least one lens in synchronization with the display.

* * * * *